(12) United States Patent
Nishimura et al.

(10) Patent No.: US 6,513,214 B2
(45) Date of Patent: Feb. 4, 2003

(54) METHOD OF PRODUCING PLURAL DEVICE CHIPS FROM A THIN PLATE OF A PYROELECTRIC MATERIAL

(75) Inventors: Makoto Nishimura, Toyonaka (JP); Kenichi Kimura, Tsu (JP); Nobuyuki Miyagawa, Takatsuki (JP); Masato Kawashima, Osaka (JP); Yoshimitsu Nakamura, Settsu (JP); Motoo Ikari, Kyoto (JP); Yuji Takada, Kyoto (JP); Ryo Taniguchi, Nara (JP)

(73) Assignee: Matsushita Electric Works, Ltd., Kadoma (JP)

( * ) Notice: Subject to any disclaimer, the term of this patent is extended or adjusted under 35 U.S.C. 154(b) by 93 days.

(21) Appl. No.: 09/807,414

(22) PCT Filed: Dec. 21, 2000

(86) PCT No.: PCT/JP00/09104

§ 371 (c)(1),
(2), (4) Date: Apr. 19, 2001

(87) PCT Pub. No.: WO01/47004

PCT Pub. Date: Jun. 28, 2001

(65) Prior Publication Data

US 2002/0133925 A1 Sep. 26, 2002

(30) Foreign Application Priority Data

Dec. 22, 1999 (JP) ............................................. 11-364918
Aug. 28, 2000 (JP) ........................................ 2000-256632

(51) Int. Cl.$^7$ ............................................. H01L 41/00
(52) U.S. Cl. ........................... 29/25.35; 29/847; 29/846
(58) Field of Search ............................... 29/25.35, 847, 29/846, 831; 216/17

(56) References Cited

U.S. PATENT DOCUMENTS

| | | | | |
|---|---|---|---|---|
| 4,920,641 A | * | 5/1990 | Nakamura | .................. 29/25.35 |
| 5,832,578 A | * | 11/1998 | Yuda et al. | ................. 29/25.35 |
| 6,192,580 B1 | * | 2/2001 | Hayami | ........................ 29/846 |

FOREIGN PATENT DOCUMENTS

| JP | 55-107273 | 8/1980 |
|---|---|---|
| JP | 7-174621 | 7/1995 |
| JP | 10-2793 | 1/1998 |

* cited by examiner

Primary Examiner—Gregory M. Vidovich
Assistant Examiner—Stephen Kenny
(74) Attorney, Agent, or Firm—Oblon, Spivak, McClelland, Maier & Neustadt, P.C.

(57) ABSTRACT

A method of producing plural device chips from a thin plate of a pyroelectric material comprises the following steps. First, plural device-forming regions each having an electrode and a circuit pattern for electrically connecting the electrodes are formed on each of front and rear surfaces of the thin plate to obtain a device substrate. By making an electrical connection between the circuit patterns, and grounding it, all of the device-forming regions on the device substrate are at the same potential. Next, a blast treatment is performed to the device substrate to remove a required region of the pyroelectric material, while leaving a bridge portion extending between adjacent device-forming regions and having the circuit patterns thereon, so that a device-chip aggregate is formed, in which adjacent device chips are coupled through the bridge portion. Subsequently, by removing the bridge portion, the device chip is separated from the device-chip aggregate.

24 Claims, 6 Drawing Sheets

METHOD OF PRODUCING PLURAL DEVICE CHIPS FROM A THIN PLATE OF A PYROELECTRIC MATERIAL

TECHNICAL FIELD

The present invention relates to a method of producing plural device chips from a thin plate of a pyroelectric material.

BACKGROUND ART

In the past, a pyroelectric infrared detector for detecting infrared radiation emanating from an object has been used as a motion sensor for detecting the motion of a person. This infrared detector is mainly composed of a substrate of a material having pyroelectric effects such as a ceramic material, e.g., $PbTiO_3$ or PZT, a single-crystal material, e.g., $LiTaO_3$, and a high-molecular compound, e.g., PVF2, and a plurality of electrodes formed by depositing an infrared absorption material such as NiCr on opposite surfaces of the substrate.

As a production method for this kind of infrared detector, for example, Japanese Patent Early Publication [KOKAI] No. 10-2793 discloses a method of producing several hundreds of infrared detectors from a single wafer, which comprises the steps of forming circuit patterns of the pyroelectric infrared detectors on the wafer of a pyroelectric material having a thickness of 40 μm and a diameter of 3 inches by use of a metal mask for photolithography, forming electrodes at required positions on the basis of the circuit patterns by depositing an infrared absorption material, and then performing a sandblast treatment or a dry-etching process to remove required regions of the wafer. The sandblast treatment is a manufacturing technique of cutting a workpiece or forming slots in the workpiece by blowing fine hard particles on the workpiece at a constant pressure. The dry-etching process comprises ion milling and RIE, which are used in the conventional semiconductor process.

The sandblast treatment has advantages that the treatment speed is high, and there is no need to use an expensive apparatus such as ion milling. On the contrary, when blowing the hard particles of inorganic materials on the wafer substrate, the polarization state of the pyroelectric material may be broken by static electricity developed on the substrate surface. As a result, there is a problem that variations in performance of the produced pyroelectric infrared devices occur, and as the worst desired device performance is not obtained. Moreover, in the case of producing large amounts of devices from a single thin wafer, there is another problem that much effort is needed to collect and arrange these devices.

SUMMARY OF THE INVENTION

In view of the above problems, an object of the present invention is to provide an improved method of producing plural device chips from a thin plate of a pyroelectric material.

That is, the method of the present invention comprises the following steps. First, a device substrate to be treated with a blast of hard particles is formed. The device substrate comprises the thin plate of the pyroelectric material, plural device-forming regions each having an electrode, which are defined on opposite two surfaces of the thin plate, and a circuit pattern formed on each of the opposite two surfaces to electrically connect the electrodes. Each of the device-forming regions is isolated from an adjacent device-forming region by a stock-removal portion. Then, an electrical connection is made between the circuit patterns formed on the opposite two surfaces of the device substrate to obtain a 3-dimensional circuit pattern, and the 3-dimensional circuit pattern is grounded so that all of the device-forming regions on the device substrate are at the same potential. Next, the device substrate having the 3-dimensional circuit pattern is treated with the blast to remove the pyroelectric material of the stock-removal portion, while leaving a bridge portion extending between adjacent device-forming regions and having the circuit patterns thereon, to thereby obtain a device-chip aggregate, in which adjacent device chips are coupled through the bridge portion. Subsequently, the device chips is separated from the device-chip aggregate by removing the bridge portion.

In the present invention, since all of the device-forming regions on the device substrate are maintained to be at the same potential by the presence of the circuit patterns on the bridge portions during the blast treatment, the polarization state of the pyroelectric material is not broken by static electricity. In addition, since plural device chips are provided as a device-chip aggregate by the blast treatment, the handling of the device-chip aggregate becomes easy, and it is possible to collect the device chips separated from the device-chip aggregate by removing the bridge portions, while maintaining an arrangement of the device chips.

In the above method, it is preferred that the electrodes and the circuit patterns are simultaneously formed by means of physical vapor deposition (PVD). In this case, it is possible to efficiently produce the device substrate.

In addition, it is preferred that the pyroelectric material of the stock-removal portion is removed such that the bridge portion is of a constricted shape having a small cross section in the middle between adjacent device chips. In this case, when separating the device chip from said device-chip aggregate, it is possible to break only the bridge portion without causing the propagation of cracks into the device chip.

In addition, it is preferred that the step of removing the bridge portion is performed by use of a table having holding means for holding the device-chip aggregate. In particular, it is preferred that the holding means has the capability of magnetically holding the device-chip aggregate on the table by use of a magnetic mask having an opening, and the step of removing the bridge portion is performed through the opening. In this case, it is possible to easily hold the device-chip aggregate on the table without contamination of the device-chip aggregate with adhesives for holding. In addition, since the bridge portion is removed through the opening formed in the magnetic mask, there is no need to worry about the contamination of the device chips with scattered particles generated when the bridge portion is removed by use of a laser.

In addition, it is preferred that one of the table and the magnetic mask has a projection on its surface, which can fit into a space between adjacent device chips of the device-chip aggregate. The positioning of the device-chip aggregate becomes easier, and it is possible to prevent the occurrence of a positional displacement of the device-chip aggregate during the removing step.

Moreover, it is preferred that the above method comprises the steps of, after the step of removing the bridge portion, catching the magnetic mask and separated device chips by use of a suction apparatus, which comprises a first suction means for catching the magnetic mask, second suction means for catching a required number of the device chips separated from the device-chip aggregate through first openings formed in the magnetic mask, and a third suction means for catching the rest of the device chips separated through second openings formed in the magnetic mask, transferring the magnetic mask and the device chips caught by the first, second and third suction means to a first position, releasing only the device chips caught by the second suction means at the first position, transferring the magnetic mask and the device chips caught by the first and third suction means to a second position, and releasing the device chips caught by the third suction means at the second position. In this case, it is possible to readily obtain an arrangement of the required number of device chips, which has an increased distance between adjacent device chips, from an original arrangement of the device chips of the device-chip aggregate. Therefore, it is effective to improve the efficiency of collecting and arranging the device chips.

It is preferred that the step of making the electrical connection between the circuit patterns comprises the steps of forming a connection end of one of the circuit patterns on a surface having a connection end of the other circuit pattern, placing a metal foil between the connection ends, and securing the metal foil by forming a resist film on the device substrate. In addition, the step of making the electrical connection between the circuit patterns may comprise the steps of forming a connection end of one of the circuit patterns on a surface having the connection end of the other circuit pattern, placing a metal foil having magnetism between the connection ends, and securing the metal foil by magnetic force. Moreover, the step of making the electrical connection between the circuit patterns may comprise the steps of forming a through hole in the thin plate of the pyroelectric material by use of a laser, and coating an interior surface of the through hole with an electrically conductive material. According to these methods, it is possible to readily make the electrical connection between the circuit patterns with reliability.

A further object of the present invention is to provide a method of producing device chips from a thin plate of a pyroelectric material, which comprises the following steps. That is, in this method, a device substrate to be treated with a blast of hard particles is firstly formed. The device substrate comprises the thin plate of the pyroelectric material, plural device-forming regions each having an electrode, which are defined on opposite two surfaces of the thin plate. Each of the device-forming regions is isolated from an adjacent device-forming region by a stock-removal portion. Then, an electrically conductive layer is formed on the entire surface of one of the opposite two surfaces of the device substrate, and the device substrate is held on a stage through the conductive layer. On the other hand, a circuit pattern is formed on the other surface of the device substrate to electrically connect the electrodes. Next, the conductive layer is electrically connected to the circuit pattern to obtain a laminate on the stage, and the laminate is grounded so that all of the device-forming regions on the device substrate are at the same potential. Next, the laminate is treated with the blast to remove the pyroelectric material of the stock-removal portion, while leaving a bridge portion extending between adjacent device-forming regions and having the circuit pattern thereon, to thereby obtain a device-chip aggregate, in which adjacent device chips are coupled through the bridge portion. Subsequently, the device chip is separated from the device-chip aggregate by removing the bridge portion.

According to this method, it is possible to prevent the breakage of the polarization state of the pyroelectric material by static electricity developed during the blast treatment, and obtain the device-chip aggregate that facilitates the separation/collection of the device chips.

Further characteristics and effects brought thereby of the present invention will be understood in detail from the best mode for carrying out the invention described below, referring to the attached drawings.

BEST MODE FOR CARRYING OUT THE INVENTION

Referring to the attached drawings, a method of producing plural device chips from a thin plate of a pyroelectric material according to a first embodiment of the present invention is explained in detail below.

Figures 1A, 1B, 1C, 1D, 1E:
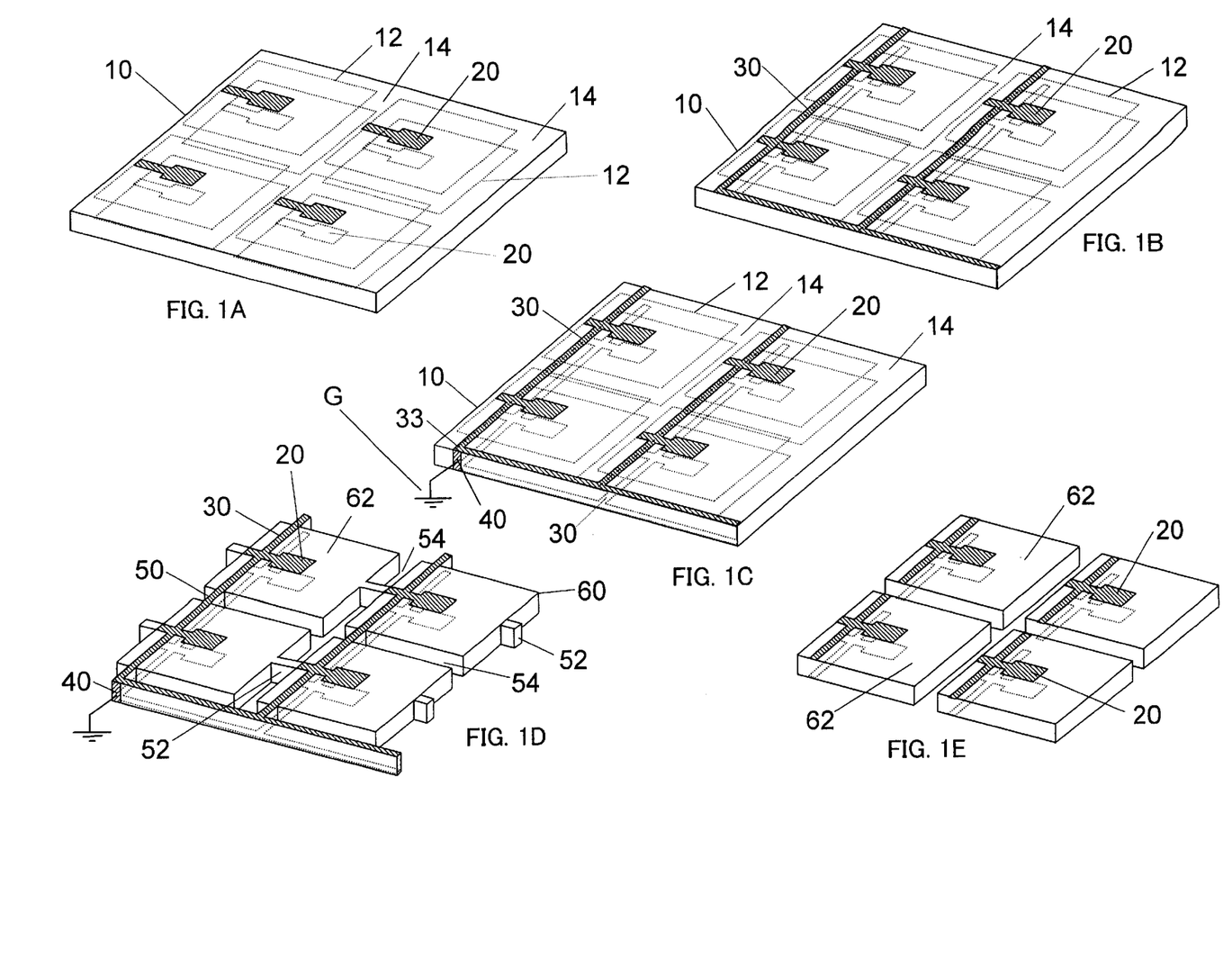
FIGS. 1A to 1E are schematic perspective views showing a method of producing plural device chips from a thin plate of a pyroelectric material according to a first embodiment of the present invention.

First, as shown in FIG. 1A, an electrical treatment (polarization treatment) is performed to a wafer substrate 10 having a thickness of 40 to 60 $\mu$m and made of a material having the pyroelectric effect, and then plural device-forming regions 12 each having an electrode 20 are formed on both of front and rear surfaces of the wafer substrate. Each of the device-forming regions 12 is isolated from an adjacent device-forming region by a stock-removal portion 14. Next, as shown in FIG. 1B, a circuit pattern 30 for connecting all of the electrodes 20 on the front surface of the wafer substrate and a circuit pattern 30 for connecting all of the electrodes 20 on the rear surface of the wafer substrate are formed. The electrodes and the circuit patterns can be simultaneously formed by means of physical vapor deposition (PVD).

Next, as shown in FIG. 1C, an electrical connection 40 is made between the circuit patterns 30 formed on the front and rear surfaces of the wafer substrate 10 to obtain a 3-dimensional circuit pattern 33, and the 3-dimensional circuit pattern is grounded G, so that all of the device-forming regions 12 on the wafer substrate 10 are at the same potential. For example, the electrical connection 40 can be formed by applying an electrically conductive material such as a conductive paste, e.g., a silver paste, conductive resist, and a conductive wax, so as to extend between the circuit patterns 30 on the front and rear surfaces of the wafer substrate 10. In addition, when using the physical vapor deposition (PVD), it is possible to form the electrodes, circuit patterns and the electrical connection between the circuit patterns 30 at a time.

By treating the wafer substrate 10 having the obtained 3-dimensional circuit pattern 33 with a blast of fine hard particles such as ceramic particles, the pyroelectric material of the stock-removal portion 14 is removed, while first bridge portions 50 each extending between adjacent device-forming regions 12 and having the circuit patterns 30 thereon are left, so that a device-chip aggregate 60, in which adjacent device chips 62 are coupled though the first bridge portion 50, is obtained, as shown in FIG. 1D. In this embodiment, in addition to the first bridge portions 50, second bridge portions 52 each extending between adjacent device-forming regions 12 and having no circuit pattern 30 thereon are formed to improve the mechanical strength of the device-chip aggregate 60. The first bridge portions 50 formed on both sides of the device chip 62 are arranged in a straight line. Similarly, the second bridge portions 52 formed on both sides of the device chip 62 are arranged in a straight line. The numeral 54 designates a slot formed between adjacent device chips 62 by removing the pyroelectric material by the blast treatment.

Figure 2:
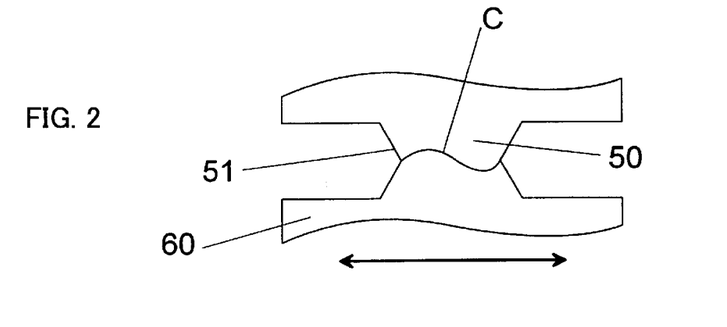
FIG. 2 is a partially plan view showing a preferred embodiment of a bridge portion extending between the device chips.

Prior to the blast treatment, it is preferred to form a resist pattern for exposing only the stock-removal portion 14 on the wafer substrate 10 to protect the surfaces of the device-forming regions 12. In addition, it is preferred that each of the first and second bridge portions 50, 52 is of a constricted shape 51 having a small cross section in the middle between adjacent device chips 62 to facilitate the crack propagation C at the bridge portion, as shown. in FIG. 2. Therefore, when removing the bridge portions 50, 52 to separate the device chips 62 from the device-chip aggregate 60, it is possible to prevent the crack propagation toward the inside of the device chip.

Due to the formation of the 3-dimensional circuit pattern 33, all of the device-forming regions 12 on the wafer substrate 10 are maintained to be at the same potential during the blast treatment. Therefore, the polarization state of the pyroelectric material is not broken by the influence of static electricity. In addition, since the device-chip aggregate 60, in which the adjacent device chips 62 are coupled through the first bridge portion 50 and the second bridge portion 52, is obtained by the blast treatment, a handling property of the device chips after the blast treatment is improved.

As shown in FIG. 1E, by removing the bridge portions 50, 52 from the device-chip aggregate 60, the device chips 62 are separated from each other. To remove the bridge portions, it is possible to use laser cutting, stamping, dicing with grinding wheels and so on. From the viewpoint of enhancing the cutting operation, it is preferred that the device-chip aggregate 60 is formed such that a direction of cutting the bridge portion (a direction shown by the arrow in FIG. 2) is in agreement with a cleavage direction of the pyroelectric material. For example, a wafer of LiTaO$_3$ that is a kind of pyroelectric material has plural cleavage directions, each of which is in every 60 degrees relative to a cleavage direction. By designing the bridge portion such that the cleavage direction is in agreement with the cutting direction of the bridge portion, it is possible to easily cut the device-chip aggregate 60, and prevent the occurrence of cracks in the device chips 62.

Figure 3A:
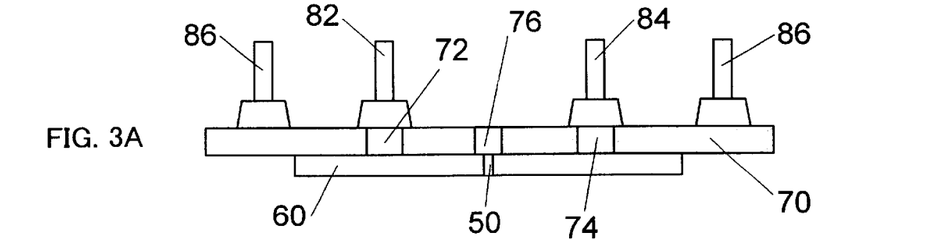
FIG. 3A is a schematic diagram of a suction apparatus for collecting the device chips.
Figure 3B:
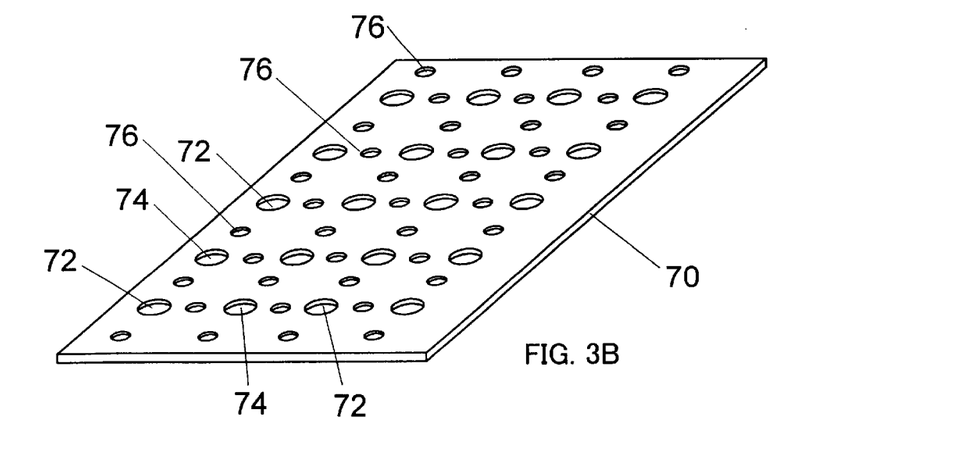
FIG. 3B is a perspective view of a magnetic mask used.
Figure 3C:
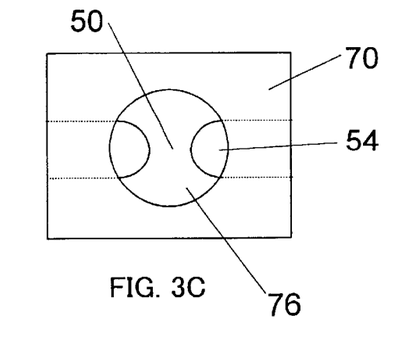
FIGS. 3C, 3D are schematic diagrams showing a step of cutting the bridge portion through an opening of the magnetic mask.
Figure 3D:
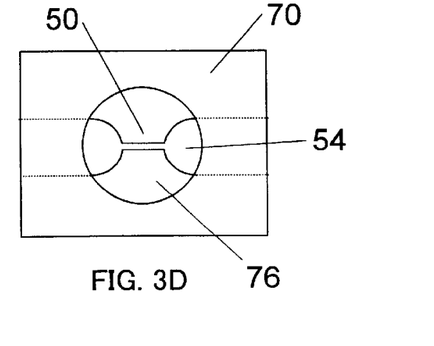

For example, it is preferred to separate the device chips 62 from the device-chip aggregate 60 according to the following procedure. That is, after the device-chip aggregate 60 is placed on a table (not shown) having the capability of generating magnetic force, a magnetic mask 70 having openings 76 is put on the device-chip aggregate. The magnetic mask 70 is held on the table by the magnetic force, so that the device-chip aggregate is secured therebetween. The magnetic mask 70 is disposed on the device-chip aggregate 60 such that the first and second bridge portions 50, 52 of the device-chip aggregate are exposed through the openings 76. As shown in FIGS. 3C and 3D, since the step of removing the bridge portions is performed through these openings 76, there is no need to worry about contamination of the device chips with scattered particles generated when removing the bridge portions by use of a laser. In addition, since this operation of removing the bridge portions can be performed in such a clean environment, it is possible to omit a cleaning process for separated device chips that is a subsequent process.

Figure 4A:
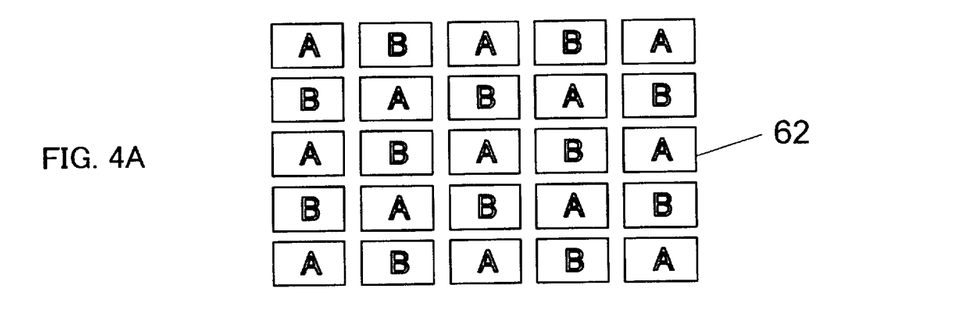
FIGS. 4A to 4C are schematic diagrams showing steps of transferring the device chips to different two positions by use of the magnetic mask of FIG. 3B.
Figure 4B:
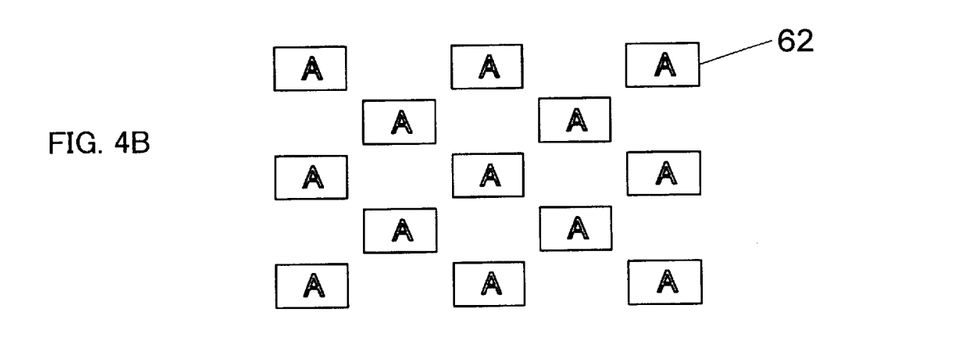
Figure 4C:
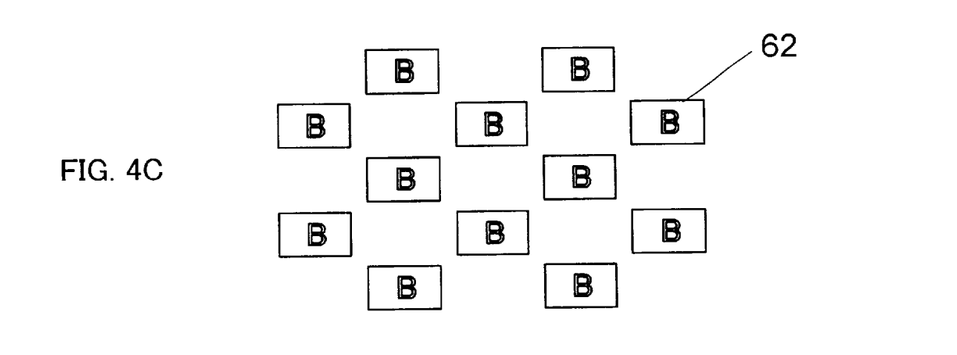

After removing the bridge portions 50, 52, the separated device chips can be collected by use of a suction apparatus described below. This suction apparatus is composed of a first suction unit 86 for catching the magnetic mask 70, second suction unit 82 for catching a required number of the device chips 62 ("A" shown in FIG. 4A) separated from the device-chip aggregate 60 through first openings 72 formed in the magnetic mask 70, third suction unit 84 for catching the rest of the device chips 62 separated ("B" shown in FIG. 4A) through second openings 74 formed in the magnetic mask 70, and a transfer unit (not shown) for transferring the device chips 62 caught by these suction units together with the magnetic mask 70. After the magnetic force for holding the magnetic mask is removed, the magnetic mask and the separated device chips caught by the first to third suction units are transferred to a first position. At the first position, only the device chips 62 ("A" shown in FIG. 4A) caught by the second suction unit 82 are released, as shown in FIG. 4B. Subsequently, the magnetic mask and the device chips caught by the first and third suction units are transferred to a second position. At the second position, the device chips ("B" shown in FIG. 4A) caught by the third suction unit 84 are released, as shown in FIG. 4C. Of course, it is possible to release all of the device chips at the first position, if necessary.

Figure 5:
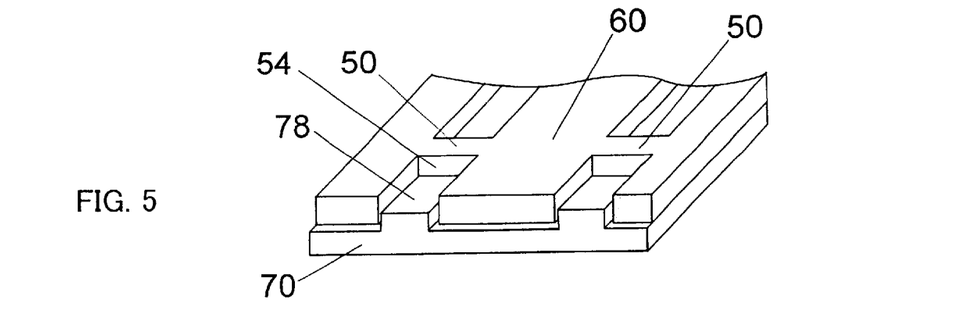
FIG. 5 is a partially perspective view of the magnetic mask having guide projections for a device-chip aggregate.

By the way, as shown in FIG. 5, it is preferred to form convex portions 78 on a surface of the magnetic mask 70 facing the device-chip aggregate 60. The convex portions 78 can fit into the slots 54 of the device-chip aggregate. In this case, it is possible to tightly hold the device-chip aggregate, and prevent the occurrence of a positional displacement of the magnetic mask 70 during the operation of removing the bridge portions 50, 52. In addition, when removing the bridge portions is finished, an arrangement of the device chips 62, in which adjacent device chips 62 are isolated from each other by the convex portion 78, is obtained on the magnetic mask 70. Therefore, it is possible to avoid a situation that the device chips overlap one another. The convex portions that can fit into the slots 54 of the device-chip aggregate may be formed on a stage such as a ceramic plate or a table for holding the device-chip aggregate.

As described above, when the device chips 62 are released at each of the first and second positions, an arrangement of the device chips having a larger pitch between adjacent device chips than the original pitch between adjacent device chips 62 of the device-chip aggregate 60 can be obtained. Therefore, it is possible to collect the device chips while maintaining a desired arrangement of the device chips. The above method of picking up the device chips is particularly effective in the case that the pitch between the adjacent device chips is about 0.1 mm.

Figure 6A:
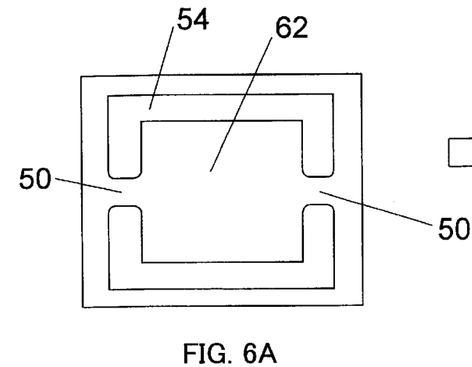
FIGS. 6A and 6B are a plan view of a preferred arrangement of the bridge portions, and a schematic view showing a separating step for the bridge portion, respectively.
Figure 6B:
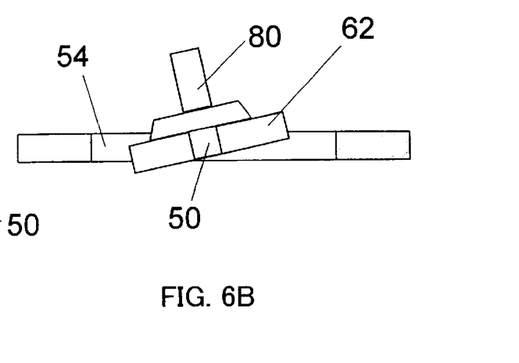

In addition, as shown in FIG. 6A, when forming a device-chip aggregate 60, in which adjacent device chips 62 are coupled through only first bridge portions 50 extending on a straight line in opposite two directions from substantially center positions of both sides of the device chip 62, the device chip can be separated from the device-chip aggregate with relative ease by catching the device chip by the suction unit 80, and applying a twist to the caught device chip, as shown in FIG. 6B, to break the bridge portions. Since the separated device chip is transferred as is caught by the suction unit, it is possible to achieve the separating operation and the pick-up operation for the device chip at a time.

Figure 7A:
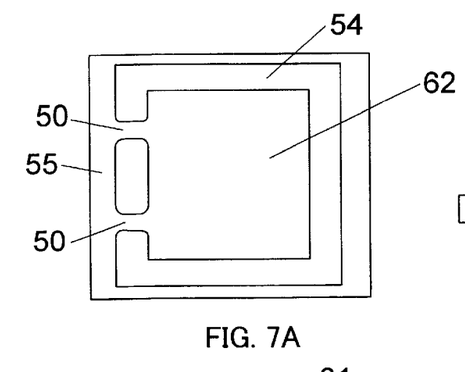
FIGS. 7A and 7B are a plan view of another preferred arrangement of the bridge portions, and a schematic view showing the separating step for the bridge portion, respectively.
Figure 7B:
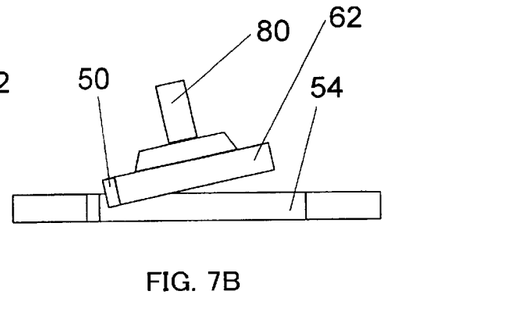

Moreover, in the above embodiment, the first and second bridge portions 50, 52 are formed to provide the device-chip aggregate 60 shown in FIG. 1D. However, a device-chip aggregate 60 having an arrangement of bridge portions described below may be formed. That is, the device-chip aggregate can be formed by removing the pyroelectric material of the stock-removal portion by the blast treatment such that the device-chip aggregate has a frame portion 55, one end of each of the bridge portions 50 is connected to the frame portion, the other end of each of the bridge portions 50 is connected to a side of the device chip 62 to support the device chip in a cantilever fashion, and adjacent device chips are coupled through the frame portion and the bridge portions. In this case, as shown in FIG. 7B, the separating operation and the pick-up operation for the device chip can be achieved at a time.

In addition, as means for holding the device-chip aggregate 60 in the step of removing the bridge portions, it is possible to use a UV sheet or a thermally-foamed sheet having a property that its adhesive force rapidly lowers by heating, or a porous plate such as a porous ceramic plate. In the later case, the device-chip aggregate placed on a surface of the porous plate can be caught by vacuum suction from the opposite surface of the porous plate.

Figure 8:
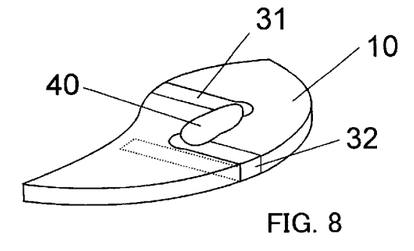
FIG. 8 is a partially perspective view showing an embodiment of a method of making an electrical connection between circuit patterns.

As described before, the electrical connection 40 between the circuit patterns 30 can be made by forming a connection end 32 of one of the circuit patterns on a surface having a connection end 31 of the other circuit pattern, and applying an electrically conductive material between the connection ends, as shown in FIG. 8. Alternatively, the electrical connection may be formed according to the following modifications.

Figure 9:
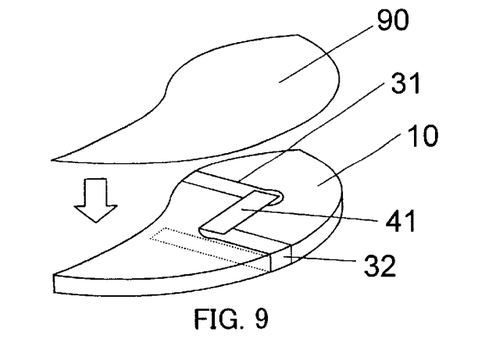
FIG. 9 is a partially perspective view showing a first modification of the method of making the electrical connection between the circuit patterns.

That is, as a first modification, as shown in FIG. 9, after the connection end 32 of one of the circuit patterns is formed on the surface having the connection end 31 of the other circuit pattern, a metal foil 41 is placed to extend between the connection ends, and secured to the position by forming a resist film 90 on the wafer substrate 10.

Figure 10A:
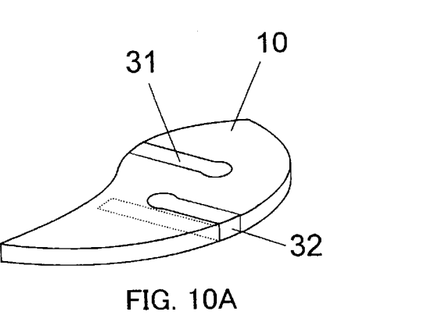
FIGS. 10A and 10B are partially perspective views showing a second modification of the method of making the electrical connection between the circuit patterns.
Figure 10B:
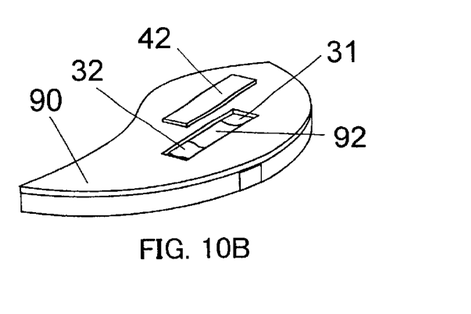
Figure 11:
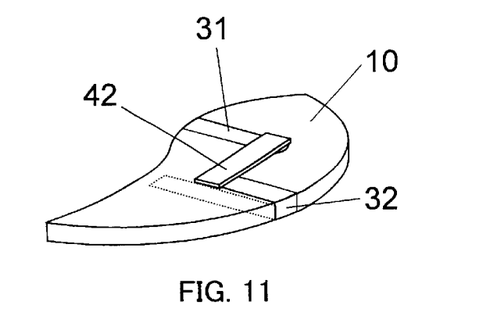
FIG. 11 is a partially perspective view showing another example of the second modification.

As the second modification, as shown in FIGS. 10A and 10B, after the connection end 32 of one of the circuit patterns is formed on the surface having the connection end 31 of the other circuit pattern, a resist film 90 is formed on the surface of the wafer substrate 10. Next, a part of the resist film corresponding to a region between the connection ends are removed to form a concave 92 for exposing the region in the resist film 90. Subsequently, a metal foil 42 having magnetic properties is fitted into the concave, and secured by a magnetic force provided from a magnet or the above-mentioned table. Alternatively, as shown in FIG. 11, the metal foil 42 may be placed at a region between the connection ends 31, 32 on the wafer substrate 10 without forming the resist film, and secured to the position by use of the magnetic force.

Figure 12:
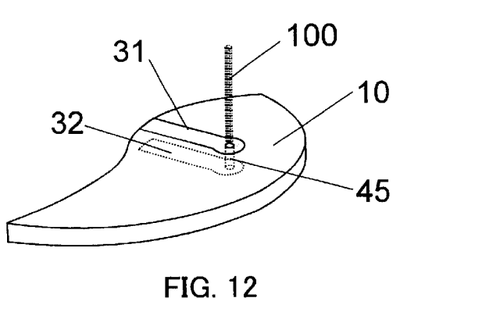
FIG. 12 is a partially perspective view showing a third modification of the method of making the electrical connection between the circuit patterns.

As the third modification, as shown in FIG. 12, after a through hole 45 penetrating between the connection ends 31, 32 is formed in the thin plate of the pyroelectric material of the wafer substrate 10 by use of a laser beam 100, an interior surface of the through hole is coated with an electrically conductive material. For example, when using the PVD method, it is possible to simultaneously achieve the step of forming the electrodes and the circuit patterns, and the step of coating the interior surface of the through hole with the conductive material. In addition, when forming a through hole penetrating between the circuit patterns in the thin plate of the pyroelectric material by use of a laser in the presence of an assist gas containing carbon, carbides having electrical conductivity of carbon and elements of the pyroelectric material are generated in the interior surface of the through hole. The carbides provide the electrical connection between the circuit patterns. As the assist gas, it is preferred to use carbon dioxide or methane gas. Moreover, it is preferred to blow the assist gas on a laser-working portion to enhance the carbide generation.

Figure 13A:
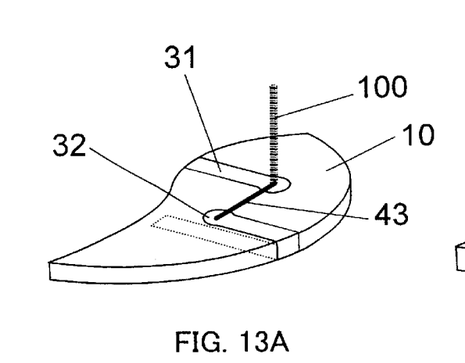
FIGS. 13A and 13B are partially perspective views showing a fourth modification of the method of making the electrical connection between the circuit patterns.
Figure 13B:
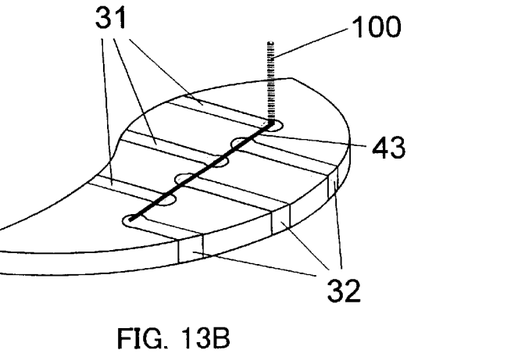

As the fourth modification, as shown in FIG. 13A, after the connection end 32 of one of the circuit patterns is formed on the surface having the connection end 31 of the other circuit pattern, a region between the connection ends is scanned by a laser beam 100 in the presence of an assist gas containing carbon. Carbides 43 having electrical conductivity generated on the laser-scanned region provide the electrical connection between the connection ends. From the viewpoint of improving the reliability of the electrical connection between the circuit patterns, it is preferred that each of the circuit patterns has a plurality of connection ends 31, 32 arranged in a comb-like manner, and the connection ends 32 of one of the circuit patterns are formed on a surface having the connection ends 31 of the other circuit pattern to obtain a staggered configuration of the connection ends 31, 32, as shown in FIG. 13B. In this case, the electrical connection between the connection ends can be achieved by performing a laser scanning in the presence of an assist gas containing carbon according to the similar manner to the above so as to join together of the connection ends of the staggered configuration.

Referring to the attached drawings, a method of producing plural device chips from a thin plate of a pyroelectric material according to a second embodiment of the present invention is explained in detail below.

Figures 14A, 14B, 14C, 14D, 14E:
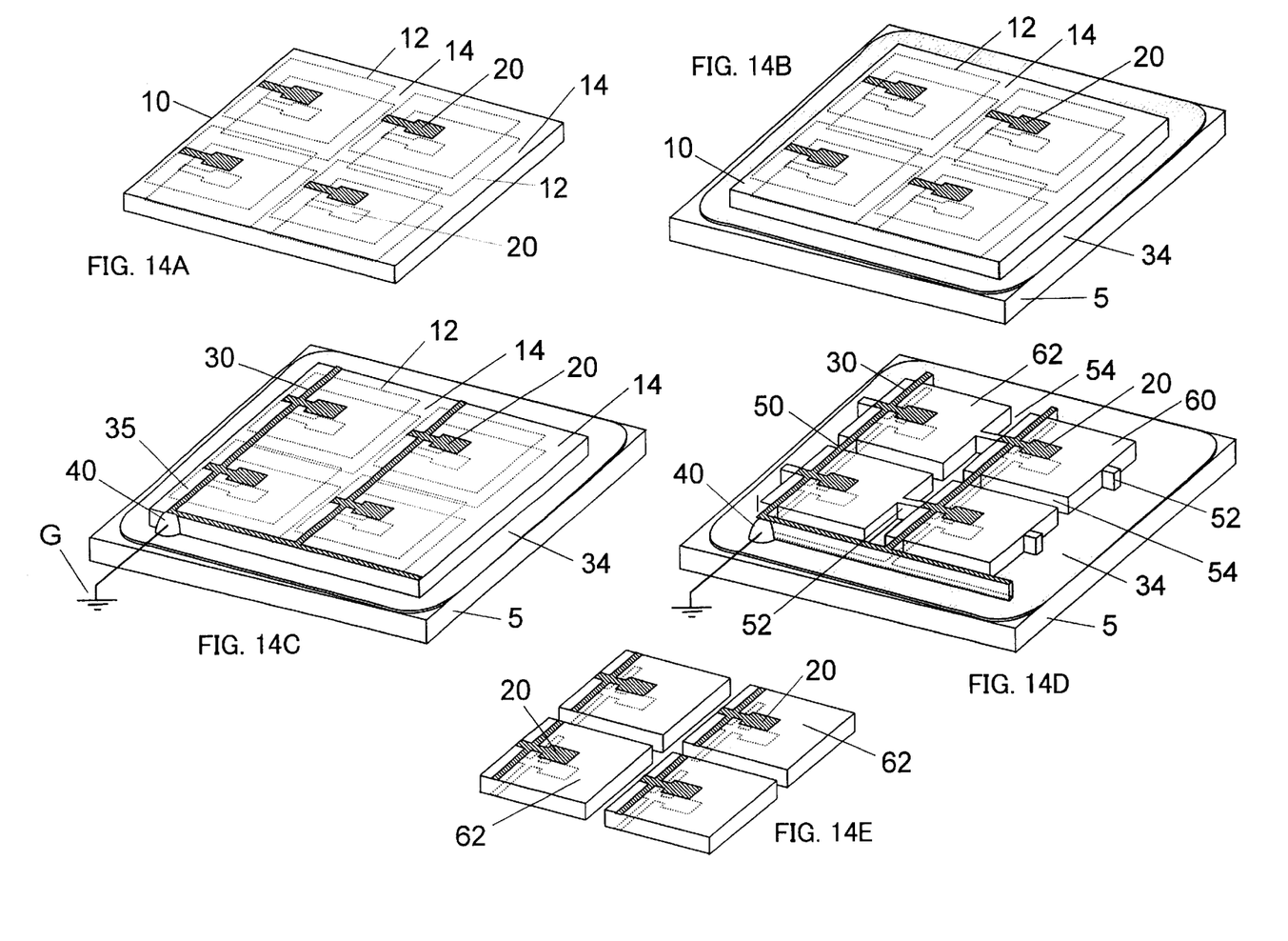
FIGS. 14A to 14E are schematic perspective views showing a method of producing plural device chips from a thin plate of a pyroelectric material according to a second embodiment of the present invention.

First, as shown in FIG. 14A, an electrical treatment (polarization treatment) is performed to a wafer substrate 10 having a thickness of 40 to 60 μm and made of a material having the pyroelectric effect, and then plural device-forming regions 12 each having an electrode 20 are formed on both of front and rear surfaces of the wafer substrate. Each of the device-forming regions 12 is isolated from an adjacent device-forming region by a stock-removal portion 14. Next, as shown in FIG. 14B, an electrically conductive layer 34 is formed on the entire surface of one of the opposite two surfaces of the wafer substrate, and the wafer substrate is secured to a stage 5 through the conductive layer. For example, it is preferred to use an electrically conductive wax as a material for the conductive layer.

Next, as shown in FIG. 14C, a circuit pattern 30 is formed on the other surface of the wafer substrate 10 to electrically connect the electrodes 20, and then the conductive layer is electrically connected to the circuit pattern to obtain a laminate 35 on the stage 5. The laminate is grounded (G) so that all of the device-forming regions 12 on the wafer substrate 10 are at the same potential. The electrical connection 40 between the conductive layer 34 and the circuit pattern 30 can be readily formed by extending the conductive wax of the conductive layer 34 to the surface having the circuit pattern 30. In addition, when the circuit pattern is formed by use of an electrically conductive resist material such that only the stock-removal portion is exposed, the resist material can protect the device-forming regions 12 from a blast treatment described later.

Next, by treating the laminate 35 with a blast of fine hard particles, the pyroelectric material of the stock-removal portion 14 is removed, while bridge portions 50 each extending between adjacent device-forming regions 12 and having the circuit pattern 30 thereon are left, so that a device-chip aggregate 60, in which adjacent device chips 62 are coupled though the bridge portions 50, 52, is obtained on the stage 5, as shown in FIG. 14D. Subsequently, the device-chip aggregate 60 is detached from the stage 5, and the bridge portions are removed from the device-chip aggregate to obtain individually-separated device chips 62, as shown in FIG. 14E.

As understood from the above embodiments, according to the method of producing the device chips from the thin plate of the pyroelectric material of the present invention, it is possible to prevent the breakage of the polarization state of the pyroelectric material by static electricity developed during the blast treatment for machining device chips of the pyroelectric material such as pyroelectric infrared detectors, and readily collect the produced device chips.

In addition, when separating the device chips from the device-chip aggregate held by use of magnetic force, and using the method of catching/transferring the device chips by use of vacuum suction, there is no need to worry about contamination of the device chips with adhesives for catching. Therefore, it is possible to omit a subsequent cleaning process. Moreover, it is possible to transfer the device chips, while maintaining the arrangement of the device chips of the device-chip aggregate. Therefore, even when producing several hundreds of small device chips from a 3-inch wafer, it is possible to efficiently produce the large amounts of the device chips with improved yields.

What is claimed is:

1. A method of producing plural device chips from a thin plate of a pyroelectric material comprising the steps of:

forming a device substrate to be treated with a blast of hard particles, said device substrate comprising the thin plate of the pyroelectric material, plural device-forming regions each having an electrode, which are defined on opposite two surfaces of the thin plate, and a circuit pattern formed on each of the opposite two surfaces to electrically connect said electrodes, and each of said device-forming regions being isolated from an adjacent device-forming region by a stock-removal portion;

making an electrical connection between the circuit patterns formed on the opposite two surfaces of said device substrate to obtain a 3-dimensional circuit pattern, and grounding said 3-dimensional circuit pattern so that all of said device-forming regions on said device substrate are at the same potential;

treating said device substrate having said 3-dimensional circuit pattern with said blast to remove the pyroelectric material of said stock-removal portion, while leaving a bridge portion extending between adjacent device-forming regions and having the circuit patterns thereon, to thereby obtain a device-chip aggregate, in which adjacent device chips are coupled through said bridge portion; and separating said device chip from said device-chip aggregate by removing said bridge portion.

2. The method as set forth in claim 1, wherein said electrodes and said circuit patterns are simultaneously formed by means of physical vapor deposition (PVD).

3. The method as set forth in claim 1, wherein said electrical connection is made by applying an electrically conductive material so as to extend between said circuit patterns on the opposite two surfaces of said device substrate.

4. The method as set forth in claim 1, further comprising the step of forming a resist film having a pattern of exposing said stock-removal portion on said device substrate prior to the step of treating said device substrate with said blast.

5. The method as set forth in claim 1, wherein the pyroelectric material of said stock-removal portion is removed such that said bridge portion is of a constricted shape having a small cross section in the middle between adjacent device chips.

6. The method as set forth in claim 1, wherein the step of removing said bridge portion is performed by use of a table having holding means for holding said device-chip aggregate.

7. The method as set forth in claim 6, wherein said holding means has the capability of magnetically holding said device-chip aggregate on said table by use of a magnetic mask having an opening, and wherein the step of removing said bridge portion is performed through said opening.

8. The method as set forth in claim 7, wherein one of said table and said magnetic mask has a projection on its surface, which can fit into a space between adjacent device chips of said device-chip aggregate.

9. The method as set forth in claim 7, comprising the steps of:

after the step of removing said bridge portion, catching said magnetic mask and separated device chips by use of a suction apparatus comprising a first suction means for catching said magnetic mask, second suction means for catching a required number of the device chips separated from said device-chip aggregate through first openings formed in said magnetic mask, and a third suction means for catching the rest of the device chips separated through second openings formed in said magnetic mask;

transferring said magnetic mask and said device chips caught by said first, second and third suction means to a first position, and releasing only said device chips caught by said second suction means at the first position; and transferring said magnetic mask and said device chips caught by said first and third suction means to a second position, and releasing said device chips caught by said third suction means at the second position.

10. The method as set forth in claim 1, wherein the step of making the electrical connection between the circuit patterns comprises the steps of forming a connection end of one of the circuit patterns on a surface having a connection end of the other circuit pattern, placing a metal foil between said connection ends, and securing said metal foil therebetween by forming a resist film on said device substrate.

11. The method as set forth in claim 1, wherein the step of making the electrical connection between the circuit patterns comprises the steps of forming a connection end of one of the circuit patterns on a surface having a connection end of the other circuit pattern, forming a resist film on the surface of said device substrate, removing a part of said resist film corresponding to a region between said connection ends to obtain a concave of exposing said region in said resist film, and fitting a metal foil having magnetism into said concave to secure said metal foil by magnetic force.

12. The method as set forth in claim 1, wherein the step of making the electrical connection between the circuit patterns comprises the steps of forming a connection end of one of the circuit patterns on a surface having a connection end of the other circuit pattern, placing a metal foil having magnetism between said connection ends, and securing said metal foil by magnetic force.

13. The method as set forth in claim 1, wherein the step of making the electrical connection between the circuit patterns comprises the steps of forming a through hole in the thin plate of the pyroelectric material by use of a laser, and coating an interior surface of said through hole with an electrically conductive material.

14. The method as set forth in claim 1, wherein the electrical connection between the circuit patterns is made by carbides generated at an interior surface of a through hole formed in the thin plate of the pyroelectric material by use of a laser in the presence of an assist gas containing carbon.

15. The method as set forth in claim 14, wherein said assist gas comprises carbon dioxide and methane gas.

16. The method as set forth in claim 1, wherein each of the circuit patterns has plural connection ends arranged in a comb-like manner, and wherein the step of making the electrical connection between the circuit patterns comprises the steps of forming the connection ends of one of the circuit patterns on a surface having the connection ends of the other circuit pattern to obtain a staggered configuration of the connection ends of the circuit patterns, and scanning a laser in the presence of an assist gas containing carbon so as to join together of the connection ends of said staggered configuration.

17. The method as set forth in claim 1, wherein the pyroelectric material of said stock-removal portion is removed such that bridge portions formed on both sides of said device chip are arranged in a straight line.

18. The method as set forth in claim 1, wherein the step of treating said device substrate with said blast is performed such that:

said device-chip aggregate has a frame portion, one end of said bridge portion is connected to said frame portion, the other end of said bridge portion extends to a side of said device chip to support said device chip in a cantilever fashion, and adjacent device chips are coupled through said frame portion and said bridge portions.

19. The method as set forth in claim 1, wherein said device-chip aggregate is formed such that a direction of cutting said bridge portion in the step of removing said bridge portion is in agreement with a cleavage direction of the pyroelectric material.

20. The method as set forth in claim 1, wherein the step of making the electrical connection between the circuit patterns comprises the steps of forming a connection end of one of the circuit patterns on a surface having a connection end of the other circuit pattern, and generating carbides by scanning a laser between the connection ends in the presence of an assist gas containing carbon.

21. The method as set forth in claim 3, wherein said electrically conductive material comprises an electrically conductive paste, electrically conductive resist material, and an electrically conductive wax.

22. A method of producing plural device chips from a thin plate of a pyroelectric material comprising the steps of:

forming a device substrate to be treated with a blast of hard particles, said device substrate comprising the thin plate of the pyroelectric material, plural device-forming regions each having an electrode, which are defined on opposite two surfaces of the thin plate, and each of said device-forming regions being isolated from an adjacent device-forming region by a stock-removal portion;

forming an electrically conductive layer on the entire surface of one of the opposite two surfaces of said device substrate, and holding said device substrate on a stage through said conductive layer;

forming a circuit pattern on the other surface of said device substrate to electrically connect said electrodes;

electrically connecting said conductive layer to said circuit pattern to obtain a laminate on said stage, and grounding said laminate so that all of said device-forming regions on said device substrate are at the same potential;

treating said laminate with said blast to remove the pyroelectric material of said stock-removal portion, while leaving a bridge portion extending between adjacent device-forming regions and having the circuit pattern thereon, to thereby obtain a device-chip aggregate, in which adjacent device chips are coupled through said bridge portion; and separating said device chip from said device-chip aggregate by removing said bridge portion.

23. The method as set forth in claim 22, wherein said conductive layer is formed by use of an electrically conductive wax, and wherein the electrical connection between said conductive layer and the circuit pattern is formed by extending said conductive wax to the surface having the circuit pattern.

24. The method as set forth in claim 22, wherein the circuit pattern is formed by use of an electrically conductive resist material such that only said stock-removal portion is exposed.

* * * * *